United States Patent
Judell

(10) Patent No.: US 11,283,476 B2
(45) Date of Patent: Mar. 22, 2022

(54) SYSTEM AND METHOD FOR CANCELLING STRONG SIGNALS FROM COMBINED WEAK AND STRONG SIGNALS IN COMMUNICATIONS SYSTEMS

(71) Applicant: RAYTHEON BBN TECHNOLOGIES CORP., Cambridge, MA (US)

(72) Inventor: Neil Judell, Cambridge, MA (US)

(73) Assignee: Raytheon BBN Technologies Corp., Cambridge, MA (US)

( * ) Notice: Subject to any disclaimer, the term of this patent is extended or adjusted under 35 U.S.C. 154(b) by 75 days.

(21) Appl. No.: 16/918,863

(22) Filed: Jul. 1, 2020

(65) Prior Publication Data
US 2021/0013914 A1    Jan. 14, 2021

Related U.S. Application Data

(60) Provisional application No. 62/871,883, filed on Jul. 9, 2019.

(51) Int. Cl.
*H04B 1/56* (2006.01)
*H04B 1/10* (2006.01)
(Continued)

(52) U.S. Cl.
CPC ............ *H04B 1/109* (2013.01); *H03D 3/007* (2013.01); *H04B 1/123* (2013.01); *H04B 1/26* (2013.01); *H04L 25/03057* (2013.01)

(58) Field of Classification Search
CPC .......... H04B 1/109; H04B 1/123; H04B 1/26; H03D 3/007; H03D 1/00; H03D 3/00; H04L 25/03057
See application file for complete search history.

(56) References Cited

U.S. PATENT DOCUMENTS 10,536,320 B2    1/2020    Judell
10,586,522 B2    3/2020    Judell
(Continued)

FOREIGN PATENT DOCUMENTS

EP    2 634 923 A1    9/2013
EP    2 676 377 A2    12/2013
EP    3 342 048       7/2018

OTHER PUBLICATIONS

International Search Report for corresponding International Application No. PCT/US2020/040922, filed Jul. 6, 2020, International Search Report dated Sep. 15, 2020 and mailed Sep. 28, 2020 (5 pgs.).

(Continued)

*Primary Examiner* — Dac V Ha
(74) *Attorney, Agent, or Firm* — Lewis Roca Rothgerber Christie LLP

(57) ABSTRACT

A receiver for cancelling strong signals from combined weak and strong signals includes: a first circuitry for inputting a weak and strong signal as an input; a parametric cancellation circuit for inputting a representation of the strong signal and an output of the first circuitry to produce a cancellation signal; a second circuitry electrically coupled to the parametric cancellation circuit for inputting the cancellation signal to produce a modulated output; a demodulator electronically coupled to the second circuitry for demodulating the modulated output to produce a demodulated output and an error signal, where the demodulated output is the data contained in the weak signal; and an adaptation logic circuit for inputting the representation of the strong signal, the demodulated output and the error signal to adaptively produce parameters for the parametric cancellation circuit. The parametric cancellation circuit fur- (Continued)

ther inputs the error signal and the parameters to produce the cancellation signal.

18 Claims, 10 Drawing Sheets

(51) Int. Cl.
  *H04B 1/12* (2006.01)
  *H04L 25/03* (2006.01)
  *H03D 3/00* (2006.01)
  *H04B 1/26* (2006.01)

(56) References Cited

U.S. PATENT DOCUMENTS

| | | | |
|---|---|---|---|
| 2004/0259502 A1* | 12/2004 | Weidner | H04B 1/109 455/63.1 |
| 2007/0030062 A1* | 2/2007 | Hibino | H04B 1/109 330/10 |
| 2014/0254725 A1 | 9/2014 | Jacob et al. | |
| 2018/0254787 A1* | 9/2018 | Goodson | H04L 23/02 |
| 2020/0336169 A1* | 10/2020 | Venkatakrishnan ... | H04B 1/109 |

OTHER PUBLICATIONS

Written Opinion of the International Searching Authority for corresponding International Application No. PCT/US2020/040922, filed Jul. 6, 2020, Written Opinion of the International Searching Authority dated Sep. 25, 2020 (6 pgs.).

* cited by examiner

SYSTEM AND METHOD FOR CANCELLING STRONG SIGNALS FROM COMBINED WEAK AND STRONG SIGNALS IN COMMUNICATIONS SYSTEMS

CROSS-REFERENCE TO RELATED APPLICATIONS

This patent application claims the benefits of U.S. Provisional Patent Application Ser. No. 62/871,883, filed on Jul. 9, 2019 and entitled "Systems for Cancelling Strong Signals from Combined Weak and Strong Signals for Communications Systems," the entire content of which is hereby expressly incorporated by reference.

FIELD OF THE INVENTION

The disclosed invention generally relates to radio frequency (RF), light-based and underwater acoustic communications and more specifically to cancelling strong signals from combined weak and strong signals in communications systems.

BACKGROUND

A system which receives weak signals in the presence of strong interfering communications signals is beneficial to performance of a network of communication nodes. One example of such a system is simultaneous transmission and reception (STAR) system. In a typical STAR system, the weak signal is any desired signal for reception, while the strong signal is the interference from a collocated transmitter. When multiple transmitters are incorporated within a single host, the transmitters are considered collocated. A typical network employs a protocol for a communicator (e.g., a transceiver) to gain access to the network, involving a request for access from a network node. This request can be confounded if another node in the network is transmitting while the requesting node is asking for access. This can result in a collision, in which several network nodes may suffer communication loss. This contention becomes quite severe in underwater acoustic communications. In these networks, nodes may be hundreds of kilometers apart, resulting in propagation times of several minutes. Waiting for access through several attempts can easily result in a completely nonfunctioning network.

Another example of a STAR application is simultaneous transmission and reception at cellular phone towers. Conventionally, interference is rejected partly physically by employing separate transmission and reception antennas and by separating transmitted (downlink) and received (uplink) frequencies. This arrangement permits operation, but at the expense of inefficient spectrum management. A further application in cellular phone towers is the "near-far" problem on the cellular phone uplink. Cellular communications signals employ signals, such as Code Division Multiple Access (CDMA), wherein phone uplinks share a common frequency but have signals that interact only weakly. This permits hundreds or thousands of phones to be serviced by a single cell tower. Transmission loss increases roughly proportional to the square of distance. Therefore, the signal from a cellular phone close to the tower tends to have much lower transmission loss than a signal from a cell phone far from the tower. However, when one cellular phone is close to the tower, but another is far away, the strong signal to interferes with the weak signal, preventing accurate demodulation and decoding of the weak signal.

Some conventional methods isolate or cancel the strong signal in one of several locations: at some non-reciprocal front-end device like a circulator, at a summing junction at or near the first stage amplifier, or at some downstream location like a processor after heterodyning. However, all of these methods suffer weaknesses in operation. Circulators offer little isolation—typically only 20 dB when isolation/cancellation of 100 dB or more is needed. Cancellation systems at other locations fall into two categories: slow/no adaptation or faster adaptation. Cancellation of 100 dB requires an accuracy and stability on the order of parts per million. Physical component stability is typically worse than this—thus requiring a system that self-adjusts (adapts) to cancel appropriately. In slow adaptation, this adjustment is a slow process, eventually converging on its optimum solution. This approach works only for static systems, in which nodes are not in motion and in which propagation paths are stable.

For most useful systems, nodes can move, and propagation paths can change rapidly. These require fast adaptation, which works by adding a representation of the strong signal to a summing junction of some kind. The adaptation method is to adjust the parameters of the representation to minimize power coming from the result of the cancellation. A significant problem for this adaptation is that the strong signal and the weak signal tend to have some correlation, where over long periods of time the correlation averages to zero. Typical short-term correlation can be 20 dB below the geometric mean power of the strong and weak signals. This correlation results in degraded cancellation behavior. One approach is to perform adaptation only when there is no received signal present. However, this involves shutting down the entire network for adaptation.

FIG. 1 is a block diagram of key elements of conventional cancellation methods for decoding weak signals in the presence of strong signals. As depicted, a signal 101a comprising the weak signal to be demodulated and decoded plus a representation of a strong interfering signal 101b is introduced to a first circuitry 102 of a receiver 100. This first circuitry may include an antenna, or a hydrophone, or a light fiber. It may also include a low noise amplifier (LNA), heterodyne shifters, baseband digitization and the like for processing the input signal. In a STAR system, the representation of the strong signal 101b may be the digital data stream to be transmitted. In a CDMA cell phone receiver, this may be the demodulated and decoded strong signal, processed elsewhere in the receiver. A parametric cancellation transformation circuit 104 operates on this signal to produce a cancellation signal 107 that is input to a summer 108. This may be achieved by gains being applied to various delay lines, like a finite impulse response (FIR) filter, modulation of the representation, nonlinear transformations to model electronic distortion and the like.

The parameters 105 of the parametric cancellation transformation circuit 104 are adaptively adjusted by an adaptation logic circuit 106, based on observations of the error signal output from the summing junction and the strong signal representation. There are many adaptation logic methods that can be applied, such as least-mean-squares (LMS), recursive least squares (RLS), gradient descent, simplex optimization, Kalman filter, or even neural network methods. Nevertheless, all conventional methods suffer a performance-limiting defect—that the weak and strong signals are not orthogonal during the adaptation time period. The second circuitry of FIG. 1 contains all other essential elements of the receiver, which may include a demodulator as well as any other necessary circuitry, such as heterodyne downconverter, equalizer and other signal processing circuits.

SUMMARY

In some embodiments, the disclosed invention is an acoustic, optical or radio frequency receiver and demodulator that cancels a strong interfering signal from a combined weak and strong signal in communications systems.

In some embodiments, the disclosed invention is a receiver for cancelling strong signals from combined weak and strong signals. The receiver includes: a first circuitry for inputting a weak and strong signal as an input; a parametric cancellation circuit for inputting a representation of the strong signal and an output of the first circuitry to produce a cancellation signal; a second circuitry electrically coupled to the parametric cancellation circuit for inputting the cancellation signal to produce a modulated output; a demodulator electronically coupled to the second circuitry for demodulating the modulated output to produce a demodulated output and an error signal, where the demodulated output is the data contained in the weak signal; and an adaptation logic circuit for inputting the representation of the strong signal, the demodulated output and the error signal to adaptively produce parameters for the parametric cancellation circuit. The parametric cancellation circuit further inputs the error signal and the parameters to produce the cancellation signal.

The receiver may be an acoustic, optical or RF receiver. The first circuitry may include one or more of an antenna, a hydrophone, a light fiber, a low noise amplifier (LNA), heterodyne shifters, and baseband digitization for processing the weak and strong signal; or may be simply a short circuit to pass through the weak and strong signal.

In some embodiments, the disclosed invention is a method for cancelling strong signals from combined weak and strong signals. The method includes: receiving a weak and strong signal and a representation of the strong signal; producing a cancellation signal responsive, in part, to the representation of the strong signal and the weak and strong signal, by a parametric cancellation circuit; modulating the cancellation signal to produce a modulated cancellation signal; demodulating the modulated cancellation signal to produce a demodulated output signal and an error signal, where the demodulated output signal is the data contained in the weak signal; and adaptively producing parameters for the parametric cancellation circuit responsive to the representation of the strong signal, the demodulated output and the error signal. Producing the cancellation signal is further responsive to the error signal and the parameters also input to the parametric cancellation circuit.

BRIEF DESCRIPTION OF THE DRAWINGS

A more complete appreciation of the disclosed invention, and many of the attendant features and aspects thereof, will become more readily apparent as the disclosed invention becomes better understood by reference to the following detailed description when considered in conjunction with the accompanying drawings in which like reference symbols indicate like components.

DETAILED DESCRIPTION

In some embodiments, the disclosed invention is an acoustic, optical or radio frequency (RF) receiver and demodulator that takes a signal that is a combination of a strong (near) signal and a weak (far) signal, where the strong signal tends to mask the weak signal. Since the (interfering) near signal is a strong signal, a precise model of the strong signal can be produced and then input to an adaptive filter. The output of the adaptive filter would try to cancel the effect of the strong signal on the combined signal to detect the weak signal. Generally, adaptive filters use the error residual to tune themselves. Typically, adaptive filters use just the input signal minus a cancellation signal as the "error" signal, which ideally, this would be just the weak signal plus channel noise. Assuming the adaptive filter can be tuned perfectly, only the weak signal would be left. Since this error signal is non-zero, it would try to move the adaptive filter off its ideal spot. However, if there's short-term correlation between the weak signal and the strong signal, the adaptive filter would be moved in a wrong direction from its ideal spot.

In some embodiments, the receiver of the disclosed invention decodes the weak signal and builds a good model of the signal. The receiver takes the result of the input signal minus the adaptive cancellation signal (cancelled signal) that goes to a weak signal demodulator to build a model of the weak signal. The receiver then subtracts that model of the weak signal from the cancelled signal to generate a second cancelled signal. This second cancelled signal is the residual noise plus any signals due to errors in the cancellation, which is utilized as the "error" signal for the adaptation process.

In some embodiments, the disclosed invention is an acoustic, optical or RF receiver and demodulator that takes a representation of the strong interfering signal and optionally buffers, amplifies, heterodynes and/or otherwise processes the weak plus strong input signal. The receiver operates on the strong signal representation, the weak plus strong signal, and an error signal output of a demodulator to create a cancellation signal. The receiver heterodynes, filters and/or otherwise modifies the cancellation signal and produces input parameters to control a parametric cancellation circuit to minimize an error signal from the demodulator. The demodulator produces both a demodulated interference-free output signal and the error signal representative of the difference between an ideal signal and the signal presented at its input.

Figure 1:
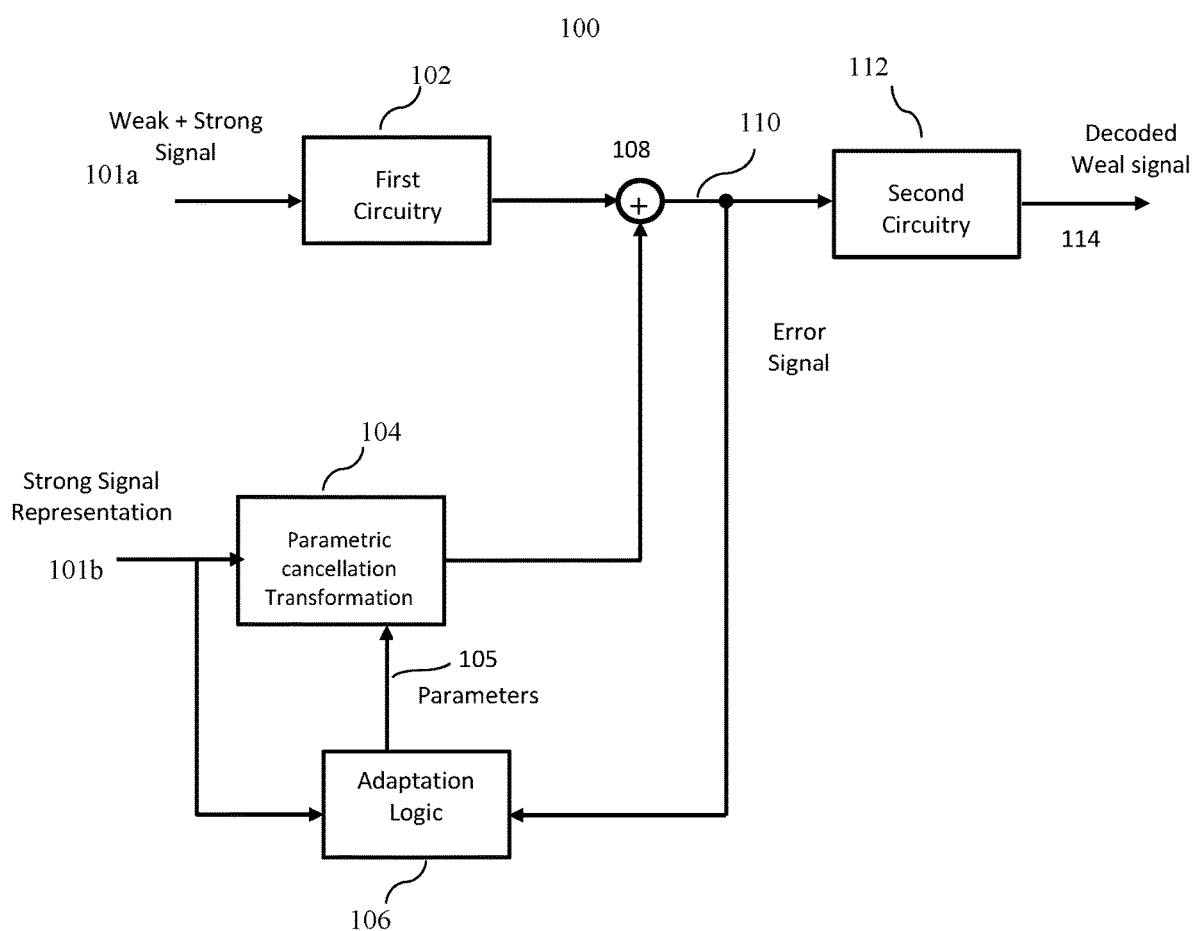
FIG. 1 is a block diagram of key elements of conventional cancellation methods for decoding weak signals in the presence of strong signals.
Figure 2:
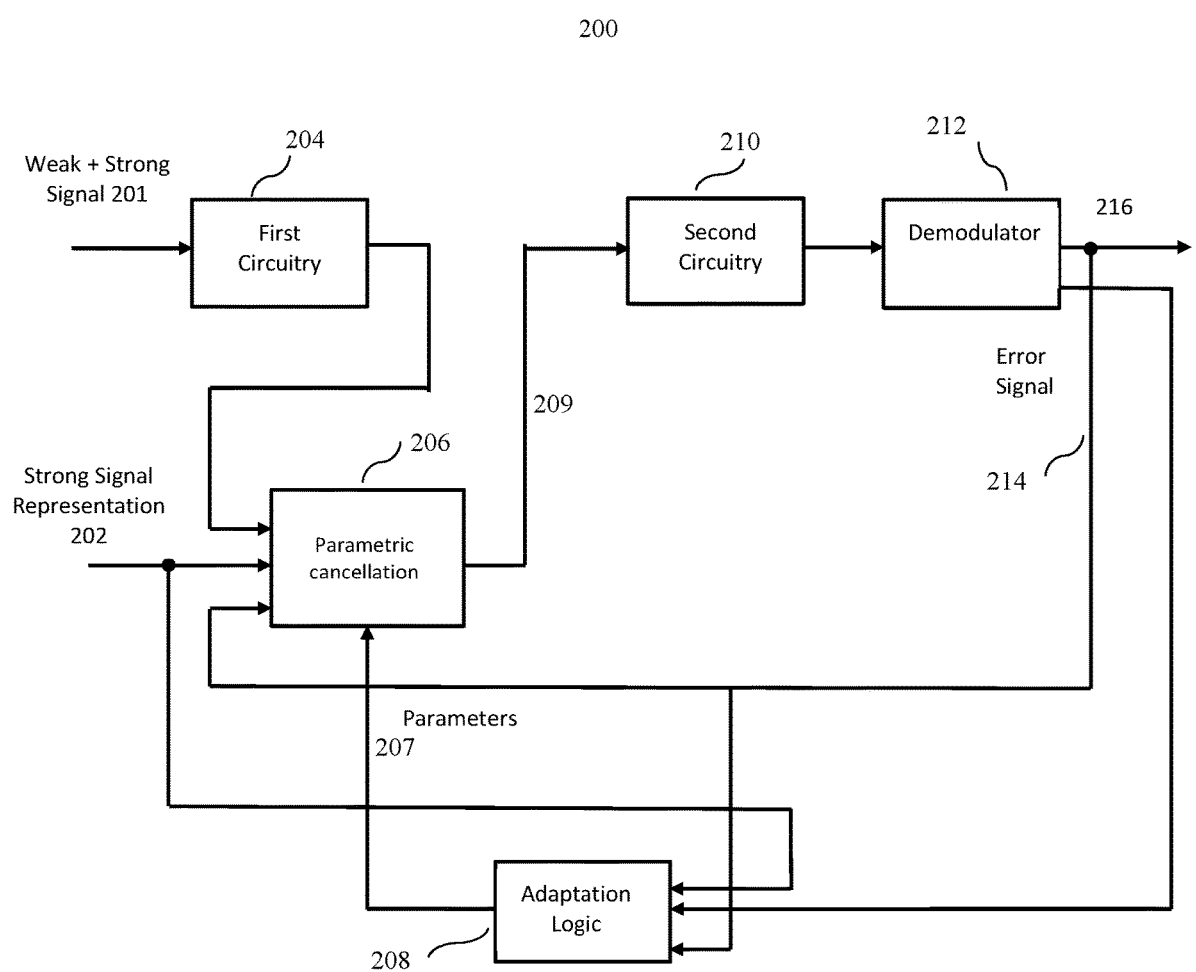
FIG. 2 is an exemplary block diagram of a receiver for decoding weak signals in the presence of strong signals, according to some embodiments of the disclosed invention.

FIG. 2 is an exemplary block diagram of a receiver 200 for decoding weak signals in the presence of strong signals, according to some embodiments of the disclosed invention. As shown, a weak & strong signal 201 is input to a first circuitry 204 and a strong signal representation 202 is input to a parametric cancellation circuit 206. The strong signal is an interfering signal that is combined with the weaker signal of interest. The strong signal representation may be data stream from a collocated transmitter, or the result of demodulating a strong signal from another source. The parametric cancellation circuit 206 operates on strong signal representation 202 to produce a cancellation signal 209. This may be achieved by gains (or parameters) being applied to various delay lines, like a finite impulse response (FIR) filter, modulation of the representation, nonlinear transformations to model electronic distortion and the like. The parametric cancellation circuit 206 takes in the strong signal representation 202, output of the first circuitry 204, and a demodulated output 214 of a demodulator 212 to produce a cancellation signal 209, which is analogous to the output of the summer 108 in the system of FIG. 1.

A second circuitry 210 takes the cancellation signal 209 as input and produces a modulated output to be demodulated by the demodulator 212. The second circuitry 210 contains all other known essential elements of the receiver, which may include a demodulator as well as any other necessary circuitry, such as heterodyne, down-converter, equalizer and such. The demodulator 212 produces a demodulated and/or decoded output 216 and an error signal 214, which represents the error between the signal present at the input of the demodulator and an ideal modulated signal. The demodulator 212 produces this ideal modulated signal from the demodulated, decoded received signal. The demodulated output is the data contained in the weak signal.

The error signal 214 is then input to an adaptation logic circuit 208. The adaptation logic circuit 208 adaptively adjusts parameters 207 to the parametric cancellation circuit 206, based on observations of the error signal 214 output from the demodulator 212. As mentioned above, there are many adaptation logic methods that can be applied in these embodiments, such as, least-mean-squares (LMS), recursive least squares (RLS), gradient descent, simplex optimization, Kalman filter, or even neural network methods. All adaptive cancellation methods seek to minimize the error signal—most typically by minimizing the mean power at the error signal, although other metrics such as peak amplitude, average absolute magnitude or other such metrics are possible, and in use. The most typical in communication systems is the mean power. Some algorithms use the principal of orthogonality—which states that when mean error power is minimized, then the error signal is orthogonal to the parametric waveforms. These typically end up adjusting parameters based on the correlation between the error signal and the parametric waveforms. Others, such as simplex, simply use a multidimensional search and "hill-climb" based on the resultant error mean power. The demodulated and/or decoded output 216, which is free of the strong signal interference is the interference-free output signal of the receiver 200. The receiver 200 is capable of operating on acoustic, optical or RF signals.

In many prior art receivers, this ideal modulated signal is used as part of an equalizer, generally known as a decision-feedback equalizer. For example, in the conventional system of FIG. 1, the error signal output 110 from the summer 108 that is presented to one of the inputs of the adaptation logic 106 is the residual version of the weak signal. Any correlation between the weak signal and the strong signal representation will cause the adaptation logic to make an adaptation that will result in poorer cancellation. However, in the new system illustrated in FIG. 2, perfect cancellation means that a perfect representation of the modulated weak signal is presented to the demodulator, which produces a zero-error signal to be presented to the adaptation logic, resulting in no net change to the perfect cancellation.

As explained above, all cancellation methods seek to minimize the error signal, by one metric or another. In a perfect case, the error signal is already at zero and thus cannot be further minimized. As a result, all optimization algorithms based on this error signal will not deviate from the perfect solution. This is in direct contrast to prior art where the error signal is not zero under the perfect initial conditions. Also, unlike the system of FIG. 1, in the system of FIG. 2, the parametric cancellation circuit 206 takes in the strong signal representation, output of the first circuitry 204, and a demodulated output of the demodulator to produce the cancellation signal 209, which is analogous to the output of the summer 108 of the system of FIG. 1.

Figure 3:
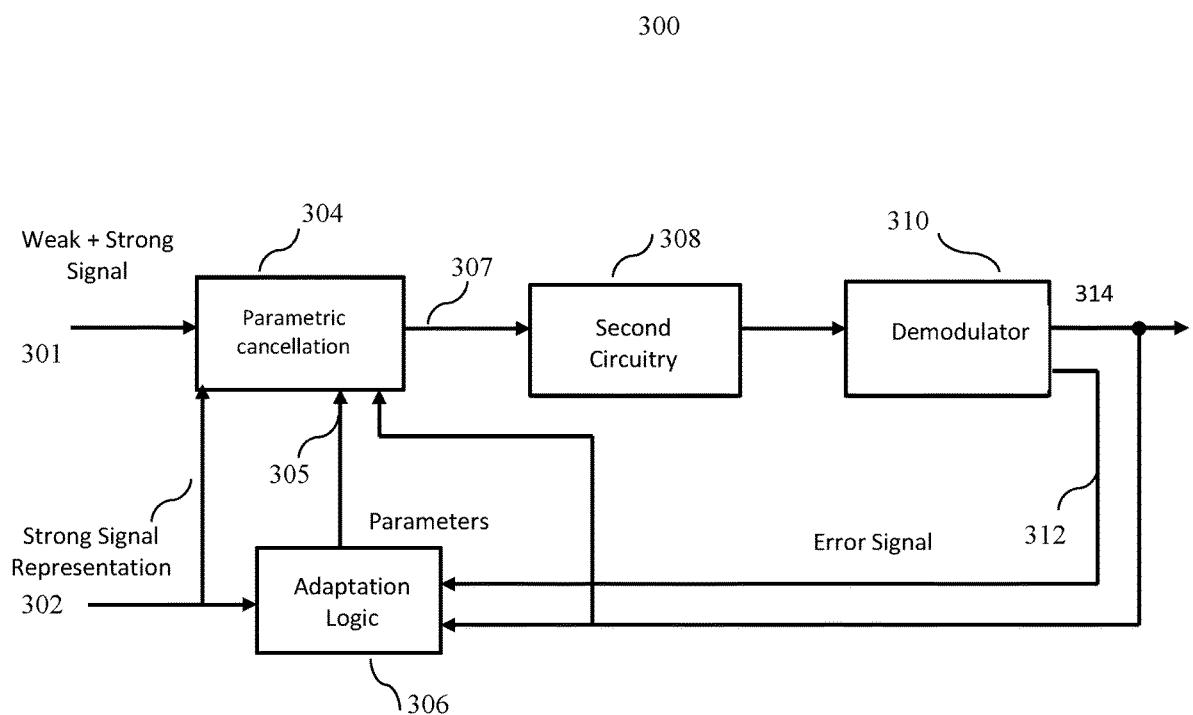
FIG. 3 is an exemplary block diagram of a receiver for decoding weak signals in the presence of strong signals to simultaneous transmit and receive signals, according to some embodiments of the disclosed invention.

FIG. 3 is an exemplary block diagram of a receiver 300 for decoding weak signals in the presence of strong signals, according to some embodiments of the disclosed invention. Similar to embodiments of FIG. 2, these embodiments are examples for a STAR system, in which the strong signal representation may be data being transmitted from a collocated transmitter of the same transceiver. As shown, the embodiments of FIG. 3 do not include the first circuitry 204 of FIG. 2. These embodiments permit cancellation ahead of a low noise amplifier (LNA) (e.g., in the second circuitry 308) to preserve the dynamic range of the LNA and subsequent electronics. The first circuitry 210 of FIG. 2 is replaced in embodiments of FIG. 3 by a pass-through wire, cable, fiber optic, or similar short circuits.

A weak & strong signal 301 is input to a parametric cancellation circuit 304, which also operates on strong signal representation 302 to produce a cancellation signal 307, using parameters 305 produced by an adaptation logic circuit 306. Similar to the receiver of FIG. 2, the strong signal is an interfering signal that is combined with the weaker signal of interest and the strong signal representation may be data stream from a collocated transmitter, or the result of demodulating a strong signal from another source. The parametric cancellation circuit 304 generates the cancellation signal 307, for example, by applying gains to various delay lines, similar to a FIR filter, modulation of the representation, nonlinear transformations to model electronic distortion and the like.

A circuitry 308 (similar to second circuitry 210 of FIG. 2) takes the cancellation signal 307 as input and produces a modulated output to be demodulated by a demodulator 310. In some embodiments, the circuitry 308 comprises an LNA and performs any heterodyne operations, base-banding, etc. The demodulator 310 produces a demodulated and/or decoded output 314 and an error signal 312, which represents the error between the signal present at the input of the demodulator and an ideal modulated signal. In other words, the demodulator 310 produces a demodulated output of the weak signal, along with an error signal representative of the difference between an ideal signal and the signal presented to the input of the demodulator. The demodulator 310 produces this ideal modulated signal from the demodulated, decoded received signal. The demodulated output of the weak signal includes the data contained in the weak signal.

The error signal 312 is then input to an adaptation logic circuit 306. The adaptation logic circuit 306 adaptively adjusts parameters 305 to the parametric cancellation circuit 304, based on observations of the error signal 312 output from the demodulator 310. The adaptation logic circuit 306 may use various known method, as described above, to adaptively adjust parameters 305. The demodulated and/or decoded output 314, which is free of the strong signal interference is the interference-free output signal of the receiver 300. The receiver 300 is also capable of operating on acoustic, optical or RF signals.

Figure 4:
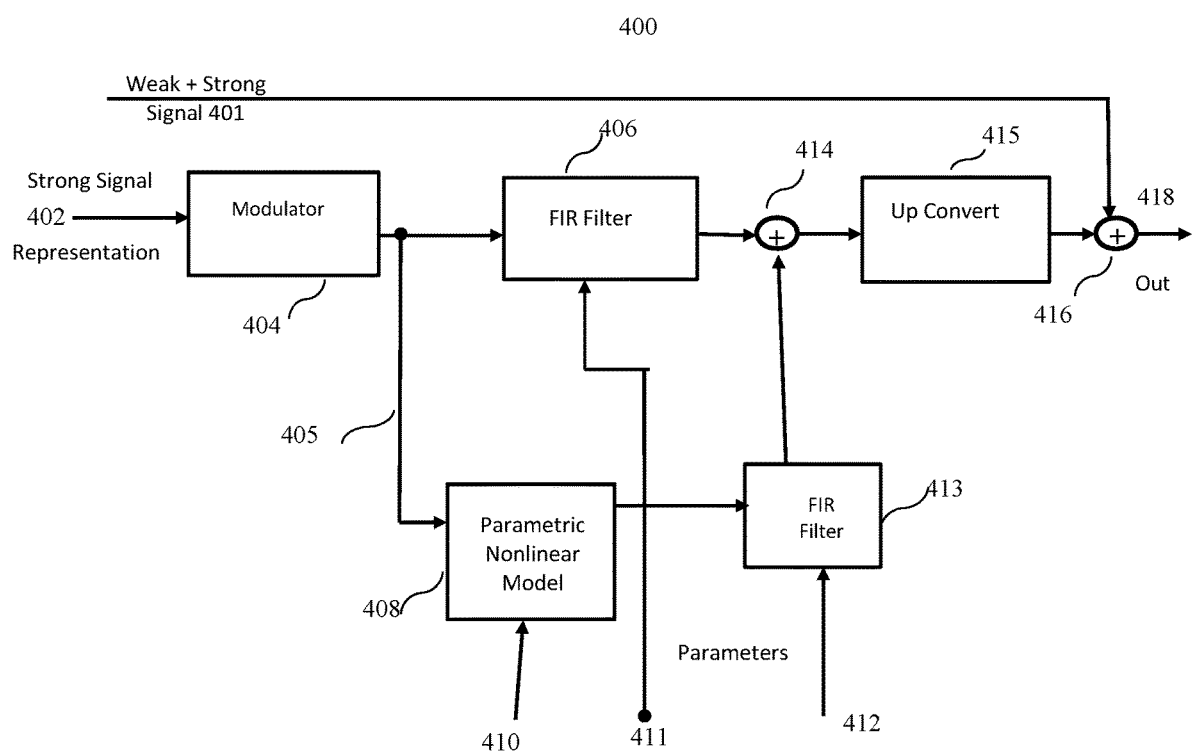
FIG. 4 is an exemplary block diagram of a parametric cancellation circuit, according to some embodiments of the disclosed invention.

FIG. 4 is an exemplary block diagram of a parametric cancellation circuit 400, according to some embodiments of the disclosed invention. The depicted parametric cancellation circuit 400 operates on both linear and nonlinear portions of the strong signal representation 402. In these embodiments, the strong signal representation 402 is a stream of data symbols. A modulator 404 modulates the strong signal representation 402 to produce a complex baseband signal 405. In some embodiments, the strong signal representation might be the complex baseband signal, obviating the need for modulator 404. The complex baseband signal 405 is input to a first adaptive filter 406 (e.g., a FIR filter) and a nonlinear parametric cancellation circuit 408, adaptively controlled by parameters 410. The nonlinear parametric cancellation circuit 408 approximates signal distortions such as, harmonic distortion or 3rd order intermodulation distortion.

The output of the nonlinear parametric cancellation circuit 408 is input to a second adaptive filter 413 (e.g., a FIR filter). The outputs of the adaptive filters 406 and 413 cancel the effect of the strong signal on the combined signal. The adaptive filters 406 and 413 use the error residual (parameters 411 and 412, respectively) to tune themselves. Parameters 410, 411 and 412 are adaptively generated by an adaptation logic circuit, similar to adaptation logic circuit 208 of FIG. 2 and 500 of FIG. 5.

The outputs of the adaptive filters 406 and 413 are then summed by a summer 414 to include both linear and nonlinear signal portions. In the case of a baseband RF signal, the output of the summer 414 may be optionally upconverted by an optional upconverter 415 to the original frequency of the input signal. The output of the summer 414 (or optionally the upconverter 415) is then added to the weak & strong signal 401 by a summer 416 to produce a cancellation signal 418, similar to cancellation signals 209 and 307 of FIGS. 2 and 3, respectively. The summer for cancellation 416 can take many forms, including a passive resistor network for RF and acoustic applications, or an optical join for fiber optic laser communications.

Figure 5:
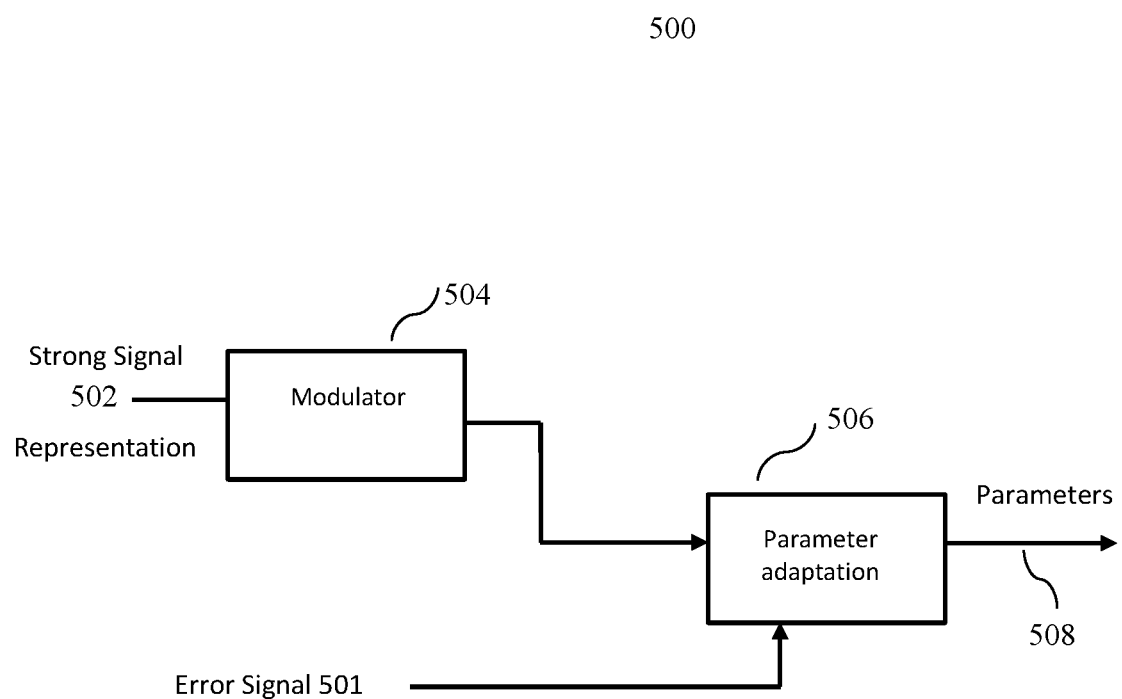
FIG. 5 is an exemplary block diagram of an adaptation logic circuit, according to some embodiments of the disclosed invention.

FIG. 5 is an exemplary block diagram of an adaptation logic circuit 500, according to some embodiments of the disclosed invention. As shown, a modulator 504 modulates the strong signal representation 502 to produce, which is a stream of data symbols. Modulator 504 generates the complex baseband signal for the strong signal. In some embodiments, the strong signal representation 502 may be the complex baseband signal, obviating the need for modulator 504. The modulated output of the modulator 504 is then input to a parameter adaptation circuit 506, along with the error signal 501 to generate parameters 508. The parameter adaptation circuit 506 may be implemented using known techniques, for example, via RLS, LMS or a Kalman variant.

Since the parametric cancellation transformation is nonlinear, an Extended Kalman Filter or Unscented Kalman Filter, for example, may successfully be utilized.

Generally, good adaptive cancellation algorithms—those that minimize the error signal metric—simultaneously adapt all parameters in a multidimensional search. Some algorithms, such as LMS, use the baseband representation to generate their own internal copies of the nonlinear representations, using these internal representations for correlation against the error signal to generate all parameters simultaneously. Other algorithms, such as simplex, do not use the signal representation, and simply adjust the parameters solely based on the measured error metric.

Note that both the parametric cancellation circuit 400 of FIG. 4 and the adaptation logic circuit 500 of FIG. 5 incorporate a modulator (404 and 504) for the strong signal representation. While this is included in FIGS. 4 and 5 for clarity, physical duplication of the modulator is not necessary, and a single modulator can be shared between the elements.

Figure 6:
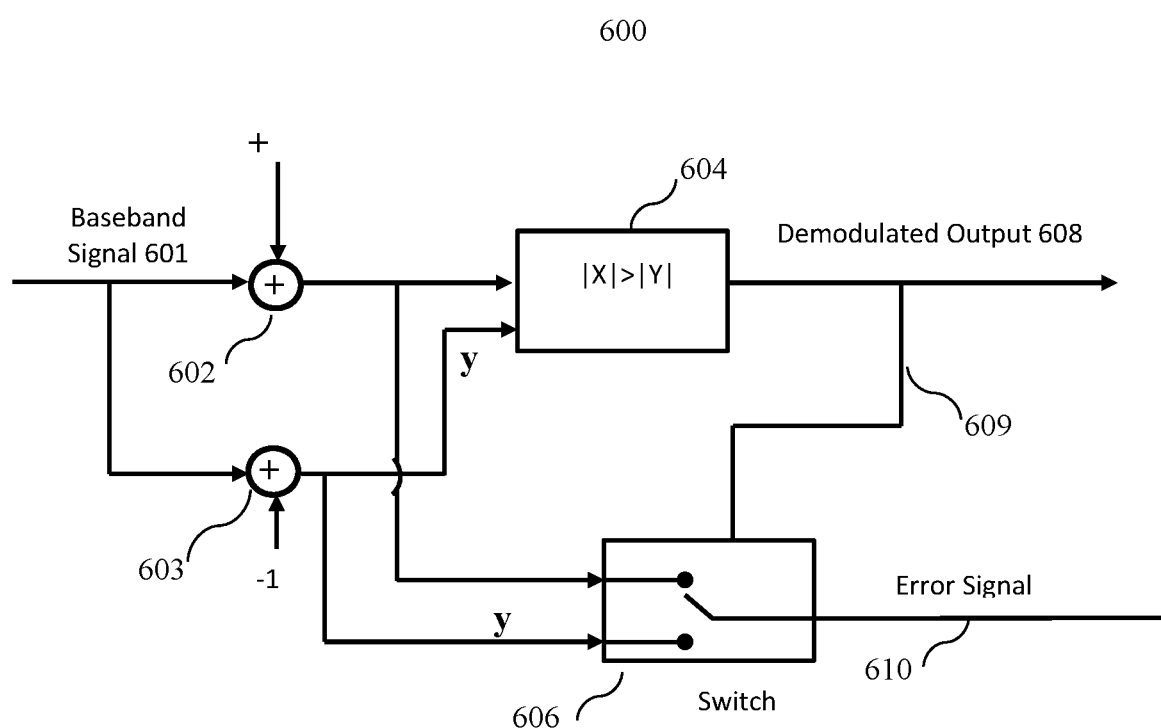
FIG. 6 is an exemplary block diagram of a demodulator that produces both a demodulated output and an error signal, according to some embodiments of the disclosed invention.

FIG. 6 is an exemplary block diagram of a demodulator 600 that produces both a demodulated output and an error signal, according to some embodiments of the disclosed invention. This demodulator may be utilized for binary phase shift keying modulation (BPSK), in which the output carrier is passed through directly to the transmitter if the data bit is 1 and is flipped in sign if the data bit is 0. At baseband, the ideal signal will be 1 for a 1 data bit and −1 for a 0 data bit. As shown, an incoming (modulated) baseband signal 601 (e.g., from second circuits 210 or 308 of FIGS. 2 and 3) is input to two summing junctions (summers 602 and 603). Summer 602 adds a "+1," while summer 603 adds a "−1" to the baseband signal.

If the modulating data within the baseband signal was 1, then ideally, the output of summer 603 is near zero, while the output of the summer 602 is near 2. If the modulating signal data was 0, then the output of the summer 602 is near zero, while the output of the summer 603 is near −2. A comparator 604 compares the complex magnitude of the outputs of the two summing junctions and controls (via its output signal 609) a switch 606 to demodulate the data to 1 or 0 by selecting the path with the smaller error. The smaller error itself is routed out as the error signal 610 to be presented to an adaptation logic circuit.

It may be readily seen that this type of demodulator can be extended to virtually any modulation method in addition to BPSK, such as quadrature phase shift keying (QPSK), in which two bits are combined to produce four possible carrier phase shifts, amplitude shift keying (ASK) in which multiple bits are combined to change the amplitude of the carrier, quadrature amplitude modulation (QAM), in which multiple bits are combined to select from a constellation of complex amplitude/phase vectors, or even CDMA using method like amplitude modulation (AM) or even minimum shift keying (MSK). Any modulation method can be accommodated by utilizing a forward modulator for the possible data bits, comparing each modulator output to the received signal, selecting the modulator output which has lowest error of representing the input, selecting that code, and outputting that modulator error signal as the demodulator error, as shown in FIG. 6.

Figure 7:
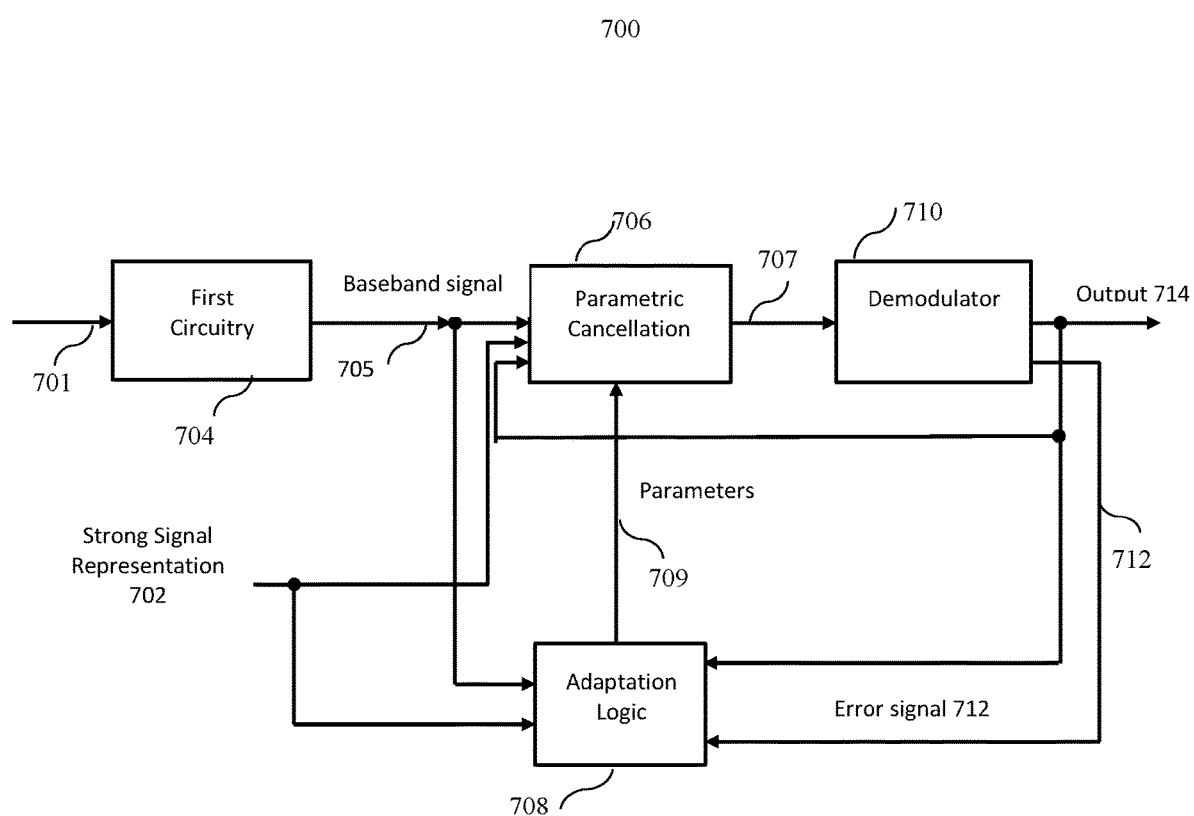
FIG. 7 is an exemplary block diagram of a receiver for decoding weak signals in the presence of strong signals, according to some embodiments of the disclosed invention.

FIG. 7 is an exemplary block diagram of a receiver 700 for decoding weak signals in the presence of strong signals, according to some embodiments of the disclosed invention. This receiver may be utilized for cancellation after a basebanding of the input signal ad therefore does not include the second circuitries 210 or 308 of FIG. 2 or 3. Receiver 700 incorporates a decision feedback equalizer and is most suitable for applications in which there is sufficient dynamic range since the decision feedback equalizer introduces a significant delay element into the system, because it needs to wait for the equalizer and the demodulation process before it can make the adjustments. This delay means that analog front-end cancellation circuits will likely not perform well, as the updates to the cancellation parameters will lag changes in the system. Therefore, this architecture is better-suited for implementations in which the LNA and subsequent components have sufficient dynamic range to fully represent the combined weak and strong signals.

As shown in FIG. 7, a weak & strong baseband signal 701 is input to a first circuitry 704 and a strong signal representation 702 is input to a parametric cancellation circuit 706. The strong signal representation may be data stream from a collocated transmitter, or the result of demodulating a strong signal from another source. The first circuitry 704 may comprise of any suitable LNA and performs any heterodyning operations, filtering and such, as needed to bring the signal to baseband. The baseband output 705 of the first circuitry 704 is input to the parametric cancellation circuit 706 and an adaptation logic circuit 708.

The difference in these embodiments from embodiments of FIGS. 2 and 3 is to incorporate a delayed-decision feedback equalization. In prior art delayed-decision equalization, a feedback loop consisting of an FIR filter is applied to the ideal modulated signal from prior data symbols and summed with the input to the demodulator to better cancel the effects of multipath and channel propagation. Delayed-decision equalizers adjust these FIR filters to minimize the error metric at the output of the demodulator. Because the delayed-decision equalizer is adjusting the error output metric, it is beneficial to incorporate the delayed-decision FIR filters and optimization in the overall cancellation algorithm. This can result in better and faster convergence to ideal solutions.

The parametric cancellation circuit 706 operates on the strong signal representation 702, the demodulator output 714 and the baseband signal 705 to produce a cancelled signal 707. This may be achieved by gains being applied to various delay lines, like a finite impulse response (FIR) filter, modulation of the representation, nonlinear transformations to model electronic distortion and the like. The parametric cancellation circuit 706 takes in the strong signal representation 702, output 705 of the first circuitry 704, and a demodulated output 714 of a demodulator 710 to produce a cancellation signal 710. Since the baseband signal 705 is already base-banded, there is no need for a second circuitries, like 210 or 308 in FIG. 2 or 3.

Demodulator 710 produces a demodulated and/or decoded output 714 and an error signal 712, which represents the error between the signal present at the input of the demodulator and an ideal modulated signal. The error signal 712 is then input to the adaptation logic circuit 708 and the parametric cancellation circuit 706. The adaptation logic circuit 708 adaptively adjusts parameters 709 to the parametric cancellation circuit 706, based on observations of the error signal 712 output from the demodulator 710, as explained with respect to FIGS. 2 and 3. As mentioned above, there are many adaptation logic methods that can be applied in these embodiments, such as, least-mean-squares (LMS), recursive least squares (RLS), gradient descent, simplex optimization, Kalman filter, or even neural network methods. The demodulated and/or decoded output 714, which is free of the strong signal interference is the interference-free output signal of the receiver 700. The receiver 700 is capable of operating on optical or RF signals.

Figure 8:
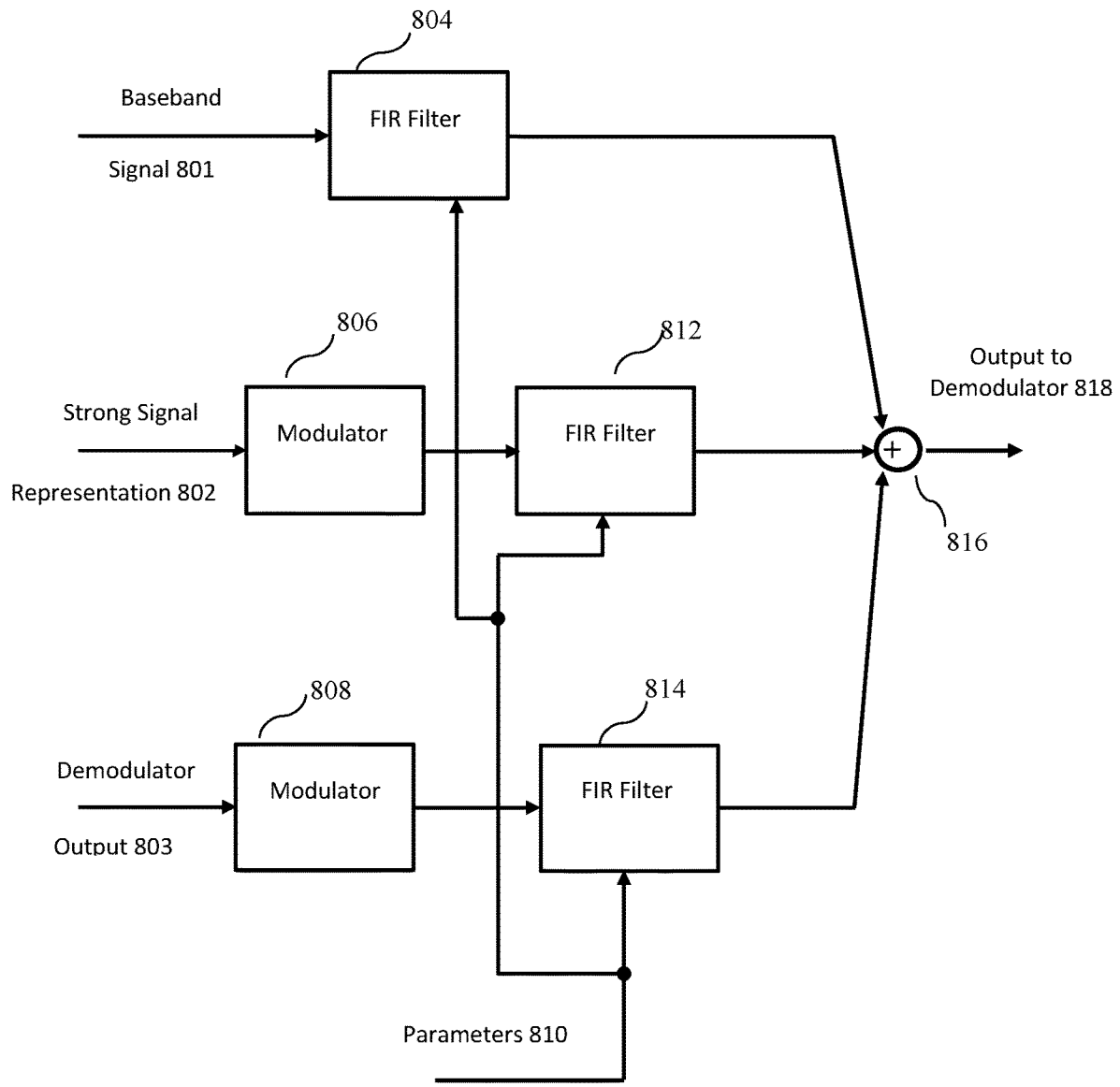
FIG. 8 is an exemplary block diagram of the parametric cancellation circuit of FIG. 7, according to some embodiments of the disclosed invention.

FIG. 8 is an exemplary block diagram of the parametric cancellation circuit of FIG. 7, according to some embodiments of the disclosed invention. As depicted, a baseband signal 801 (e.g., signal 705 in FIG. 7) is input to a first adaptive (FIR) filter 804, a strong signal representation 802 (e.g., signal 702 in FIG. 7) is modulated by a first modulator 806 and then input to a second adaptive (FIR) filter 812, and a demodulator output 803 (e.g., signal 714 in FIG. 7) is modulated by a second modulator 808 and then input to a third adaptive (FIR) filter 814. The parameters 810 of the first, second and third adaptive filters are separately generated by the adaptation logic circuit (708), similar to those illustrated in FIG. 4. The outputs of the first, second and third adaptive filters (840, 812 and 814) are then summed by a summer 816 to produce the output 818, which is input to modulator 710, in FIG. 7.

In some embodiments, the first adaptive (FIR) filter 804 acts to filter the baseband signal, while the third adaptive (FIR) filter 814 acts on the modulated ideal demodulated signal. These elements may be recognized as elements of a decision feedback equalizer—a circuit common in most modern communications receivers to help improve signal quality in the presence of multipath and inter-symbol interference. Second adaptive (FIR) filter 812 acts on the modulated strong signal representation. Together the outputs of the three adaptive filters are combined to make the best possible representation of the modulated weak signal.

Figure 9:
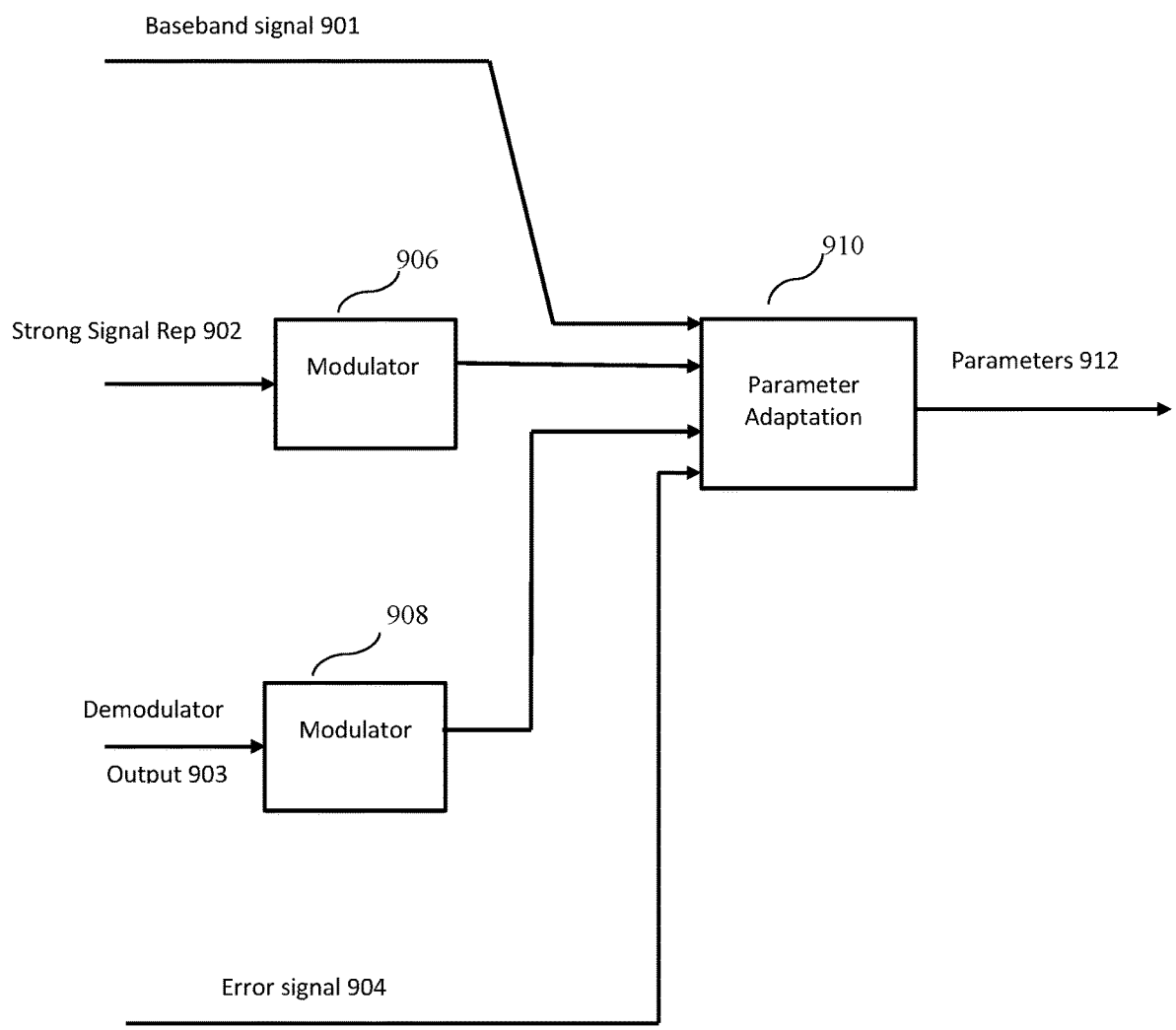
FIG. 9 is an exemplary block diagram the adaptation logic circuit of FIG. 7, according to some embodiments of the disclosed invention.

FIG. 9 is an exemplary block diagram the adaptation logic circuit of FIG. 7, including example details of elements of the equalizer adaptation, according to some embodiments of the disclosed invention. As illustrated, a baseband signal 901 (e.g., signal 705 in FIG. 7), a strong signal representation 902 (e.g., signal 702 in FIG. 7) modulated by a first modulator 906, a demodulator output 903 (e.g., signal 714 in FIG. 7) modulated by a second modulator 908 and an error signal 904 (e.g., signal 712 in FIG. 7) are all input to the adaptation logic circuit 910 to generate parameters 912.

The adaptation logic is responsible for this and uses the error output of the demodulator. In a perfect cancellation situation, with perfect equalization, the demodulator error signal is identically zero, and results in no further adaptation. Adaptation algorithms for the decision feedback equalizer, lacking the strong signal cancellation components, are well-known in the art and include LMS, RLS, gradient descent and Kalman filters, among others. These algorithms may readily be modified to incorporate the strong signal representation paths to achieve both equalization and cancellation. Incorporation of nonlinear parametric models in the strong signal path can readily be accommodated by using Extended Kalman filters or Unscented Kalman filters. Some equalizers omit the decision feedback path.

It is noted that both the parametric cancellation circuit and the parameter adaptation logic incorporate modulators for the strong signal representation and for the demodulator output. It is not necessary to duplicate the modulators. The modulator for the strong signal representation can be shared by both the parametric cancellation circuit and the parameter adaptation logic. Similarly, the modulator for the demodulator output can be shared between the parametric cancellation circuit and the parameter adaptation logic. The duplications of the modulators in the figures is for clarity purpose.

In some embodiments, the receiver of FIGS. 7, 8 and 9 may be augmented by including a parametric nonlinear model and fourth adaptive (FIR) filter to be applied to the strong signal representation modulator output, with the output of the fourth FIR filter also going to the summing junction. The adaptation logic circuit can also be expanded to include this nonlinearity, permitting further cancellation of distortion products introduced in various elements.

Figure 10:
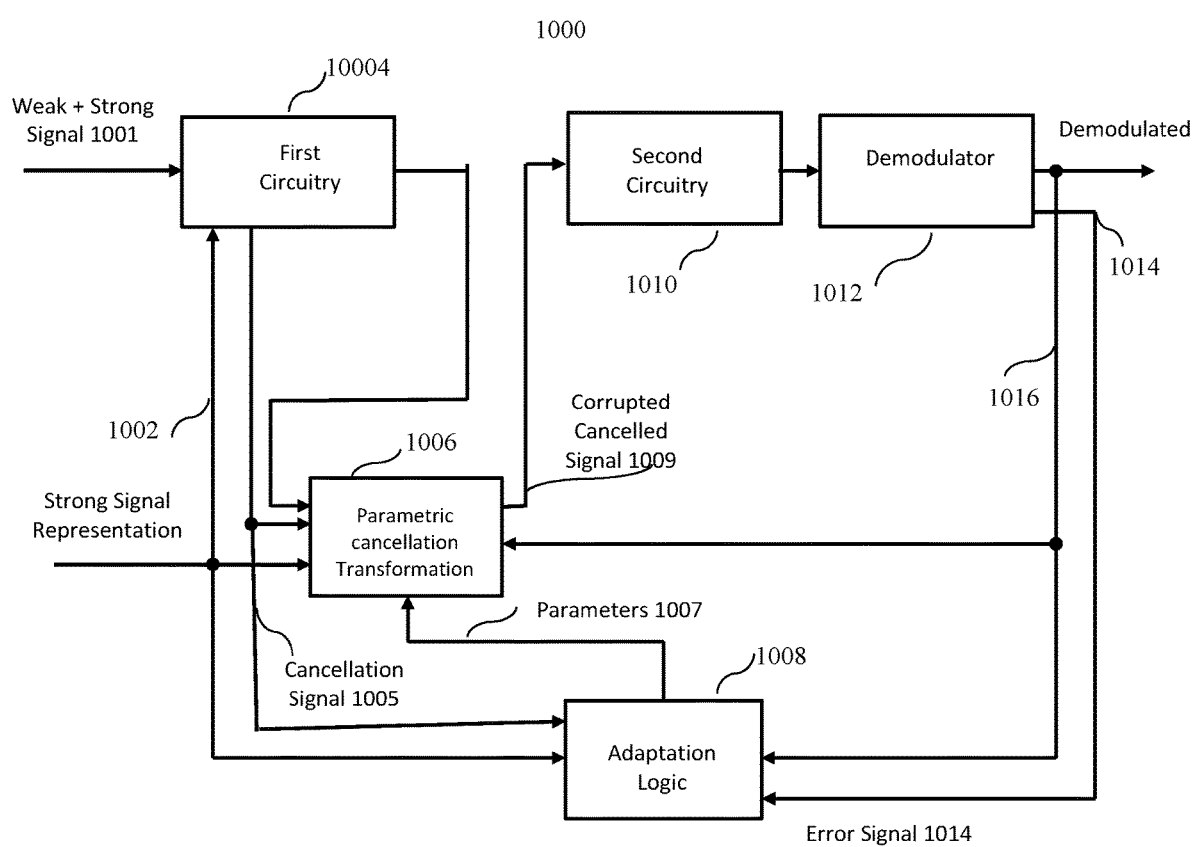
FIG. 10 is an exemplary block diagram of a receiver for decoding weak signals in the presence of strong signals, according to some embodiments of the disclosed invention.

FIG. 10 is an exemplary block diagram of a receiver 1000 for decoding weak signals in the presence of strong signals, according to some embodiments of the disclosed invention. These embodiments, combine the prior art receiver shown in FIG. 1 with the improved receiver shown in FIG. 2, according to some embodiments of the disclosed invention. It is noted that the prior art system of FIG. 1 is imperfect, since the weak signal is erroneously employed in creating the cancellation signal, as described above. It may be desirable to combine the present disclosure with such a prior art system, since the prior art is an effective means for improving the dynamic range of the front-end electronics. This receiver 1000 is most useful for "deep analog" cancellation of an RF signal early on, for example, at the analog front end.

As shown, a weak & strong signal 1001 is input to a first circuitry 1004 and a strong signal representation 1002 is input to a parametric cancellation circuit 1006. Circuitry 1004 is a prior-art analog cancellation system, which minimizes the error metric for a signal which includes the weak signal. As explained above, this circuitry cannot produce an ideal cancellation due to the presence of the desired weak signal in the optimization metric. This therefore results in at least a reduction in the desired weak signal power, as the optimizer seeks to optimize everything in the error signal. The analog cancellation signal used by this stage is brought out in signal 1005. The parametric cancellation circuit 1006 operates on strong signal representation 1002 to produce a corrupted cancelled signal 1009 since the output of the first circuitry 1004 is corrupted. The parametric cancellation circuit 1006 takes in the strong signal representation 1002, output of the first circuitry 1004, a demodulated output 1016 of a demodulator 1012 and a cancellation signal 1005 to produce the corrupted cancelled signal 1009. In some embodiments, the cancellation signal 1005 is the output of the parametric cancellation transformation shown in FIG. 1. By using this signal in the improved circuitry, the error introduced by the first circuitry prior art cancellation can be removed, providing the benefits of both types of systems, such as improved dynamic range and improved cancellation.

A second circuitry 1010 takes the corrupted cancelled signal 1009 as input and produces a modulated output to be demodulated by the demodulator 1012 for generate the model of the interference-free weak signal at the output of the receiver. The second circuitry 1010 contains all other known essential elements of the receiver, which may include a demodulator as well as any other necessary circuitry, such as heterodyne, down-converter, equalizer and such. Demodulator 1012 produces the demodulated and/or decoded output 1016 and an error signal 1014, which represents the error between the signal present at the input of the demodulator and an ideal modulated signal. Demodulator 1012 produces this ideal modulated signal from the demodulated, decoded received signal.

The error signal 1014 is then input to an adaptation logic circuit 1008, along with the strong signal representation 1002 and the cancellation signal 1005. The adaptation logic circuit 1008 adaptively adjusts parameters 1007 to the parametric cancellation circuit 1006, based on observations of the error signal 1014 output from the demodulator 1012. As mentioned above, there are many adaptation logic methods that can be applied in these embodiments, such as, least-mean-squares (LMS), recursive least squares (RLS), gradient descent, simplex optimization, Kalman filter, or even neural network methods. The demodulated and/or decoded output 1016, which is free of the strong signal interference is the interference-free output signal of the receiver 1000, which is capable of operating on acoustic, optical or RF signals.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope of the invention as defined by the appended claims and drawings.

What is claimed is:

1. A receiver for cancelling strong signals from combined weak and strong signals comprising:
   a first circuitry for inputting a weak and strong signal as an input;
   a parametric cancellation circuit for inputting a representation of the strong signal and an output of the first circuitry to produce a cancellation signal;
   a second circuitry electrically coupled to the parametric cancellation circuit for inputting the cancellation signal to produce a modulated output;
   a demodulator electronically coupled to the second circuitry for demodulating the modulated output to produce a demodulated output and an error signal, wherein the demodulated output is the data contained in the weak signal; and
   an adaptation logic circuit for inputting the representation of the strong signal, the demodulated output and the error signal to adaptively produce parameters for the parametric cancellation circuit, wherein
      the parametric cancellation circuit further inputs the error signal and the parameters to produce the cancellation signal.

2. The receiver of claim 1, wherein the receiver is an acoustic, optical or radio frequency (RF) receiver.

3. The receiver of claim 1, wherein the first circuitry comprises one or more of an antenna, a hydrophone, a light fiber, a low noise amplifier (LNA), heterodyne shifters, and baseband digitization for processing the weak and strong signal.

4. The receiver of claim 1, wherein the first circuitry is a short circuit to pass through the weak and strong signal.

5. The receiver of claim 1, wherein the second circuitry comprises one or more of a demodulator, heterodyne down-converter and an equalizer.

6. The receiver of claim 1, wherein the parametric cancellation circuit includes a finite impulse response (FIR) filter.

7. The receiver of claim 1, wherein the adaptation logic circuit utilizes least-mean-squares (LMS), recursive least squares (RLS), gradient descent, simplex optimization, Kalman filter, or neural network to adaptively produce parameters for the parametric cancellation circuit.

8. The receiver of claim 1, wherein the parametric cancellation circuit operates on both linear and nonlinear portions of the strong signal representation.

9. The receiver of claim 8, wherein the parametric cancellation circuit comprises of:
   a modulator to modulate the strong signal representation to produce a complex baseband signal;

a first adaptive filter electrically coupled to the modulator and controlled by first adaptive parameters to adaptively filter the complex baseband signal to produce a first filtered output;

a nonlinear parametric cancellation circuit electrically coupled to the modulator and controlled by third adaptive parameters to approximate signal distortions;

a second adaptive filter electrically coupled to the nonlinear parametric cancellation circuit and controlled by second adaptive parameters to adaptively filter the signal distortions and produce a second filtered output;

a first summer electrically coupled to the first adaptive filter and the second adaptive filter to mix the first filtered output and the second filtered output; and a second summer electrically coupled to the first summer and the weak and strong signal to mix an output of the first summer and the weak and strong signal to produce the cancellation signal.

10. The receiver of claim 9, wherein the parametric cancellation circuit further includes an upconverted to upconvert the output of the first summer, when the weak signal is a baseband radio frequency (RF) signal.

11. The receiver of claim 1, wherein the adaptation logic circuit comprises of:

a modulator for modulating the strong signal representation to produce a modulated strong signal representation; and a parameter adaptation circuit for inputting the error signal, the modulated strong signal representation and the error signal to adaptively produce the parameters for the parametric cancellation circuit.

12. The receiver of claim 11, wherein the adaptation logic circuit utilizes least-mean-squares (LMS), recursive least squares (RLS), Extended Kalman Filter or Unscented Kalman Filter to produce the parameters for the parametric cancellation circuit.

13. The receiver of claim 1, wherein the demodulator comprises of:

a first summer for inputting the modulated output of the second circuitry to add a +1 to the modulated output;

a second summer for inputting the modulated output of the second circuitry to add a −1 to the modulated output;

a comparator coupled to the first and second summers to compare an output of the first summer to an output of the second summer; and a switch controlled by an output of the comparator to demodulate the modulated output of the second circuitry to 1 or 0 by selecting a path with a smaller error to produce the error signal.

14. A method for cancelling strong signals from combined weak and strong signals, the method comprising:

receiving a weak and strong signal and a representation of the strong signal;

producing a cancellation signal responsive, in part, to the representation of the strong signal and the weak and strong signal, by a parametric cancellation circuit;

modulating the cancellation signal to produce a modulated cancellation signal;

demodulating the modulated cancellation signal to produce a demodulated output signal and an error signal, wherein the demodulated output signal is the data contained in the weak signal; and adaptively producing parameters for the parametric cancellation circuit responsive to the representation of the strong signal, the demodulated output and the error signal, wherein producing a cancellation signal is further responsive to the error signal and the parameters also input to the parametric cancellation circuit.

15. The method of claim 14, wherein the weak signal is an acoustic, optical or radio frequency (RF) signal.

16. The method of claim 14, wherein producing a cancellation signal responsive utilizes a finite impulse response (FIR) filter.

17. The method of claim 14, wherein adaptively producing parameters utilizes least-mean-squares (LMS), recursive least squares (RLS), gradient descent, simplex optimization, Kalman filter, or neural network to adaptively produce parameters for the parametric cancellation circuit.

18. The method of claim 14, wherein the parametric cancellation circuit operates on both linear and nonlinear portions of the strong signal representation.

* * * * *